(12) United States Patent
Geissler et al.

(10) Patent No.: US 6,410,962 B2
(45) Date of Patent: Jun. 25, 2002

(54) STRUCTURE FOR SOI WAFERS TO AVOID ELECTROSTATIC DISCHARGE

(75) Inventors: Stephen Frank Geissler, Underhill; Steven Howard Voldman, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 09/829,308

(22) Filed: Apr. 9, 2001

Related U.S. Application Data (62) Division of application No. 09/346,457, filed on Jul. 1, 1999, now Pat. No. 6,245,600.

(51) Int. Cl.⁷ .............................................. H01L 23/62
(52) U.S. Cl. ...................... 257/355; 257/347; 257/350; 438/155
(58) Field of Search ................. 438/404, 423, 438/219, 129, 155, 598; 257/355, 347, 350

(56) References Cited

U.S. PATENT DOCUMENTS

| | | | |
|---|---|---|---|
| 4,989,057 A | | 1/1991 | Lu |
| 5,403,783 A | | 4/1995 | Nakanishi et al. |
| 5,489,792 A | | 2/1996 | Hu et al. |
| 5,569,621 A | * | 10/1996 | Yallup et al. |
| 5,610,790 A | | 3/1997 | Staab et al. |
| 5,629,544 A | | 5/1997 | Voldman et al. |
| 5,672,994 A | | 9/1997 | Au et al. |
| 5,759,907 A | | 6/1998 | Assaderaghi et al. |
| 5,760,444 A | | 6/1998 | Okumura |
| 5,773,326 A | | 6/1998 | Gilbeert et al. |
| 5,784,235 A | | 7/1998 | Otomo et al. |
| 5,811,857 A | | 9/1998 | Assaderaghi et al. |
| 5,828,106 A | | 10/1998 | Sato |
| 5,841,169 A | | 11/1998 | Beasom |
| 5,863,823 A | | 1/1999 | Burgener |
| 5,864,162 A | | 1/1999 | Reedy, et al. |
| 6,071,803 A | * | 6/2000 | Rutten et al. |
| 6,074,899 A | | 6/2000 | Voldman |
| 6,107,125 A | * | 8/2000 | Jaso et al. |
| 6,121,661 A | | 9/2000 | Assaderaghi, et al. |

* cited by examiner

*Primary Examiner*—Tuan H. Nguyen
(74) *Attorney, Agent, or Firm*—Scully, Scott, Murphy & Presser; Richard M. Kotulak (57) ABSTRACT

A method of dissipating charge from a substrate of an SOI device is provided wherein a charge dissipation path is formed in the device so that it abuts the various layers thereof. Exemplary charge dissipation paths include high conductive materials, resistive means, and field emission or arc discharge means. SOI structures having said charge dissipation path formed therein are also provided. SOI ESD circuits between SOI substrate and chip ground Vss are provided herein.

15 Claims, 6 Drawing Sheets

STRUCTURE FOR SOI WAFERS TO AVOID ELECTROSTATIC DISCHARGE

This application is a divisional of U.S. application Ser. No. 09/346,457, filed Jul. 1, 1999, now U.S. Pat. No. 6,245,600.

FIELD OF THE INVENTION

The present invention relates to silicon-on-insulator (SOI) devices, and more particular to an SOI device which comprises at least a charge dissipation path abutting the various layers of the SOI device which substantially eliminates electrostatic charge from the substrate of an SOI device.

BACKGROUND OF THE INVENTION

In semiconductor processing, SOI technology is becoming increasingly important since it permits the formation of high-speed integrated circuits. In SOI technology, a relatively thin layer of semiconducting material, e.g. Si, overlays a layer of insulating material (buried oxide region). This relatively thin layer of semiconducting material is generally the area wherein active devices are formed in SOI devices. Devices formed on SOI offer many advantages over their bulk Si counterparts, including higher performance, absence of latch-up, higher packing density and low voltage applications.

Despite the advantages obtained using SOI technology, SOI circuits, like other electronic devices, are susceptible to electrostatic discharge (ESD), i.e. a surge in voltage (negative or positive) that occurs when a large amount of current is applied in the circuit. Moreover, the handling of SOI devices themselves may lead to charging of the substrate.

To discharge electrostatic impulses, ESD protection schemes need a low voltage turn-on and a high current drive (the ability to generate or sink a large amount of current before a large amount of negative or positive voltage is developed). Traditional bulk overvoltage protection schemes, such as diodes, do not work well on SOI because of the presence of the relatively thin SOI buried oxide layer. That is, conventional diodes on SOI devices have small current drivability because the current is carried laterally (limited by the thickness of the semiconductor material).

One approach for protecting SOI circuitry from ESD is found in U.S. Pat. No. 4,989,057 to Lu. The Lu reference discloses a gated diode, which could be used for ESD design. The gate diode disclosed in Lu consists of a floating-body SOI transistor, with the gate connected to a signal pad. Although the diode disclosed in Lu can provide some ESD protection, the disclosed diode does not allow for obtaining ideal diode characteristics. Some reasons preventing ideal diode characteristics with the diodes disclosed in Lu include: (1) alignment tolerance of the substrate causes large process-induced variations; and (2) the conventional diode structure may be a polysilicon diode, which receives extensions and halo implants (implants normally utilized in deep sub-micron MOSFETs) that degrades the ideal characteristics on SOI.

Other ESD protection schemes for the front side of the SOI wafer are also known. Common to each is that the energy developed across prior art ESD protection schemes can be substantial. Thus, the heat generated by such ESD protection schemes must be dissipated by the relatively thin semiconducting layer. In cases wherein the heat becomes too excessive, destruction of the SOI circuit may occur.

In view of the above drawbacks with prior art ESD protection schemes, there is a need for developing new and improved ESD protection schemes that can be used for dissipating electrostatic charge from the substrate of an SOI wafer.

SUMMARY OF THE INVENTION

One object of the present invention is to provide an ESD protection scheme that can be used in dissipating the electrostatic charge from the substrate of an SOI wafer.

Another object of the present invention is to provide an ESD protection scheme that can be used with conventional back end of the line processing.

A still further object of the present invention is to provide an ESD protection scheme that eliminates charge discharge model (CDM) failure mechanisms, field induced-charging, and loss of control of backside of the SOI wafer which may, if not eliminated, result in parasitic turn-on of SOI bottom channel MOSFETs.

CDM failures are common concern in SOI devices when the substrate below the buried oxide layer is connected to a Vss power bus. Charge developed on the substrate below the buried oxide layer will occur due to the capacitance formed between the package and the substrate wafer. The stored charge may have a capacitance above 1000V. When the SOI substrate is connected to the Vss power bus rail and to a chip through a low resistance element surrounding the chip, any charge developed on the Vss will also be in electrical contact with any element that is connected to the Vss bus (N-channel sources, body-contacted MOSFETs, etc.). When the pin is grounded, the charge stored on the Vss power grid and the substrate will discharge through the physical element.

Another issue with SOI devices is that the contact is distributed so that the current is resistor ballasted through the substrate and the natural resistance of the substrate assists in the charge distribution and slows the speed of the rapid discharge.

In view of the above, another object of the invention is thus to provide an ESD protection scheme which can dissipate charge from the substrate of an SOI wafer to an alternative short path avoiding overvoltage or electrostatic overstress of SOI active devices, or discharge to the Vss ground power rail.

A yet further object of the invention is to decrease the rapid discharge path by introduction of resistive contacts to the substrate of an SOI wafer.

These and other objects and advantages are obtained in the present invention by utilizing a novel ESD protection scheme wherein a charge dissipation path abuts the interconnect level, the active device level, i.e. the semiconducting layer, the buried oxide (BOX) region and the substrate of an SOI device. Specifically, the present invention provides various methods and structures that can be used for dissipating the electrostatic charge from the substrate of an SOI device.

In accordance with one aspect of the present invention, a method of dissipating the electrostatic charge from a substrate of an SOI device is provided which comprises the steps of:

providing an SOI device, said SOI device comprising one or more interconnect levels, one or more active device regions, a buried oxide (BOX) region and a substrate; and forming a charge dissipation path in said SOI device, wherein said charge dissipation path abuts the one or more interconnect levels, the one or more active device regions, the BOX region and the substrate of the SOI device.

The present method contemplates the utilization of high conductance materials, resistive means, and field emission or arc discharge means as possible charge dissipation paths. Combinations of the various kinds of charge dissipation paths are also contemplated herein.

In another aspect of the present invention, a structure for dissipating electrostatic charge from a substrate of an SOI device is provided. In accordance with this aspect of the present invention, the inventive structure comprises:

an SOI device comprising a substrate, a buried oxide layer formed on said substrate, a layer of semiconducting material, e.g. Si, formed on said buried oxide layer and an interconnect level formed on said layer of semiconducting material, said SOI device further comprising a charge dissipation path that abuts said interconnect level, said layer of semiconducting material, said buried oxide layer and said substrate.

DETAILED DESCRIPTION OF THE INVENTION

The present invention, which provides methods for dissipating electrostatic charge from the substrate of an SOI device as well as SOI structures for achieving charge dissipation, will now be described in greater detail by referring to the drawings that accompany the present application. It is noted that like reference numerals are used in the accompanying drawings to describe like and/or corresponding elements of the same.

Figure 1:
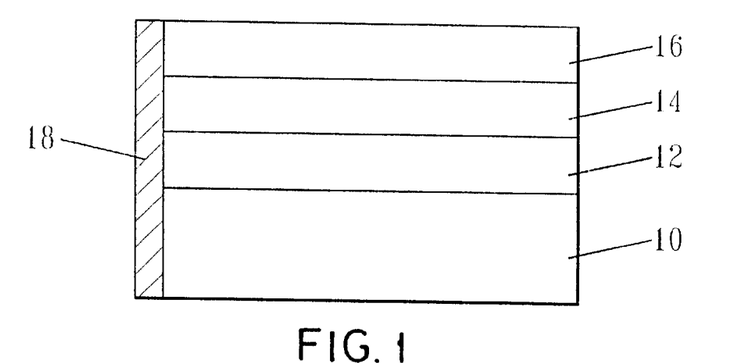
FIG. 1 is a cross-sectional view depicting one possible SOI device of the present invention wherein an external conductive material is employed as the charge dissipation path.
Figure 2:
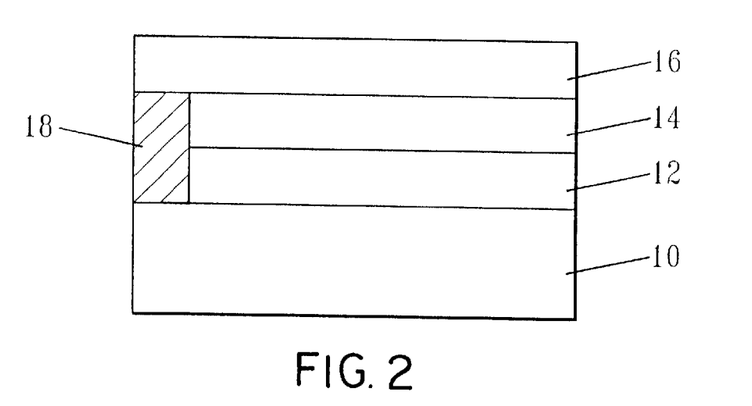
FIG. 2 is a cross-sectional view depicting one possible SOI device of the present invention wherein an embedded edge connector is employed as the charge dissipation path in an SOI wafer.
Figure 3:
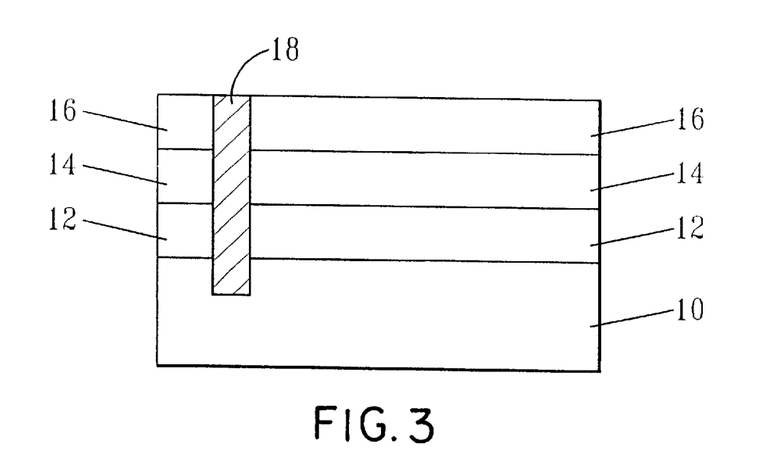
FIG. 3 is a cross-sectional view depicting one possible SOI device of the present invention wherein a trough containing a conductive material is employed as the charge dissipation path.
Figure 6:
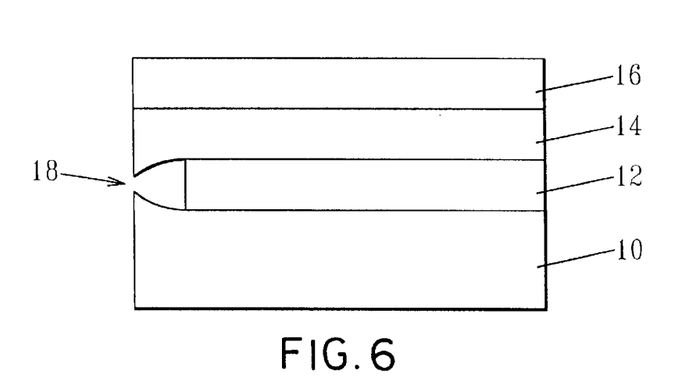
FIG. 6 is a cross-sectional view depicting one possible SOI device of the present invention wherein a field emission device or spark gap is employed as the charge dissipation path.

As stated above, the present invention provides a method for dissipating charge from the substrate of an SOI device, said method comprising the use of a charge dissipation path that abuts all the layers that make-up the SOI device. The present invention contemplates the use of high conductive materials, the use of resistive means (resistors, circuits, fuses, etc.), and the use of field emission or arc discharge means as charge dissipation paths. Examples of each of the above means are given in the drawings that accompany the present application. It is noted that high conductive materials are depicted in FIGS. 1–3; resistive means are shown in FIGS. 4–5 and 7–10, and field emission or arc discharge means are shown in FIG. 6. It is further noted that although illustration is given for the specific embodiments shown and described, the present invention contemplates the use of any charge dissipation means which abuts the various layers of an SOI device.

Turning first to FIGS. 1–3, there are shown various SOI structures of the present invention wherein a charge dissipation path 18 abuts semiconductor substrate 10, buried oxide region 12, semiconducting material layer 14 and interconnect level 16 of the SOI device. The SOI devices shown in the figures of the present invention minus the charge dissipation path are fabricated using conventional techniques that are well known in the art including: SIMOX (separation by implantation of oxygen) for forming BOX region 12 in semiconductor substrate 10; forming a semiconducting material layer 14 on said BOX region using thermal growing techniques or conventional deposition processes such as chemical vapor deposition (CVD), plasma-assisted CVD, or sputtering; forming active devices in semiconductor material layer 14; and back end of the line processing which forms the interconnect level.

The various layers forming the initial SOI device, i.e. layers 10, 12, 14 and 16, are composed of conventional materials well known in the art. For example, semiconductor substrate 10 is composed of any semiconducting material including, but not limited to: Si, Ge, SiGe, GaAs, SiC, InAs, InP and other III/V compounds. The semiconductor substrate may be doped or undoped with a suitable dopant material and it may contain one or more active device regions therein.

Semiconducting material layer 14 is composed of any of the above mentioned semiconducting materials which can be the same or different from that of semiconductor substrate 10. A highly preferred semiconducting material for layer 14 is Si. Semiconducting material layer 14 may contain one or more active device regions therein which may or may not be isolated from each other by standard isolation means. It is noted that the active device regions are not shown in either semiconductor substrate 10 or semiconducting material layer 14 of the accompanying drawings, nevertheless those regions as well as others are intended to be included therein.

Interconnect level 16 is composed of any dielectric material such as, but not limited to: SiO, $Si_3N_4$, diamond-like carbon, paralyene polymers, polyimides, silicon-containing polymers and other like dielectric materials. The interconnect level is formed on semiconducting layer 14 using conventional deposition processes such as chemical vapor deposition, plasma-assisted chemical vapor deposition, spin-on coating, sputtering and other like deposition processes. Metal interconnects, which are not shown in the drawings, are formed in layer 16 by first forming a via and/or trench in the dielectric layer using conventional lithography and RIE, then filling said via and/or trench with a suitable conductive material and thereafter planarizing the SOI structure.

In FIG. 1, charge dissipation path 18 is an externally applied conductive material such as a metallic material or conductive polymer which is formed on the sidewall of the SOI device so as to abut layers 10, 12, 14 and 16 of the SOI device. Exemplary metallic materials that can be employed in the present invention in forming charge dissipation path 18 include: metals, noble metals, noble metal oxides or mixtures and multilayers thereof. Preferred metallic materials that can be employed in the present invention are metallic paints or films that contain silver, gold, platinum, copper, tungsten, tantalum, titanium and other like conductive metals.

Exemplary conductive polymers that may be employed in the present invention include, but are not limited to: polyanilines, conjugated polyacetylenes, ionic conductive Li PEG derivatives, polyether-ester-amides, polyoxyethylene, polyethylene glycol (PEG)-derived polyurethane oligomers, polyurethane and other like polymers that are capable of serving as a conductive layer.

The conductive layer is applied to at least one sidewall of the SOI device using chemical vapor deposition, plasma-assisted chemical vapor deposition, plating, sputtering, dip-coating, brushing and other like deposition means. The conductive material may be deposited over the entire sidewall of the SOI structure such as shown in FIG. 1 or it can be applied to any portion thereof so long as the charge dissipation path abuts layers 10, 12, 14 and 16 of the SOI device.

A second SOI structure of the present invention is shown in FIG. 2. In this structure, charge dissipation path 18 is formed in buried oxide layer 12 and semiconducting material layer 14 on a sidewall of the SOI device. As shown, the in-laid charge dissipation path abuts all the layers of the SOI device, e.g. layers 10, 12, 14 and 16. This structure is formed by using conventional lithography and reactive ion etching (RIE) followed by a fill process and, if necessary, conventional planarization such as chemical-mechanical polishing or grinding. A conductive material as mentioned above may be employed in this embodiment of the present invention. Other etching processes besides RIE can also be employed in the present invention in fabricating the structure shown in FIG. 2. For example, any dry etch process such as plasma etching and ion beam etching or a wet etch process can be employed. When a wet etch process is employed, a suitable chemical etchant such as hot phosphoric acid which is highly selective in etching layers 12 and 14 is employed.

A third SOI structure that can be formed in the present invention contains a conductive filled trough structure such as shown in FIG. 3. The conductive filled trough, which forms charge dissipation path 18, is formed through layers 16, 14 and 12 as well as a portion of semiconductor substrate 10 using conventional lithography and etching, e.g. RIE, and thereafter the trough is filled with a suitable conductive material, e.g. metallic material or polymeric material. If needed, the SOI structure can be planarized using chemical-mechanical polishing after filling the trough.

Figures 4, 5:
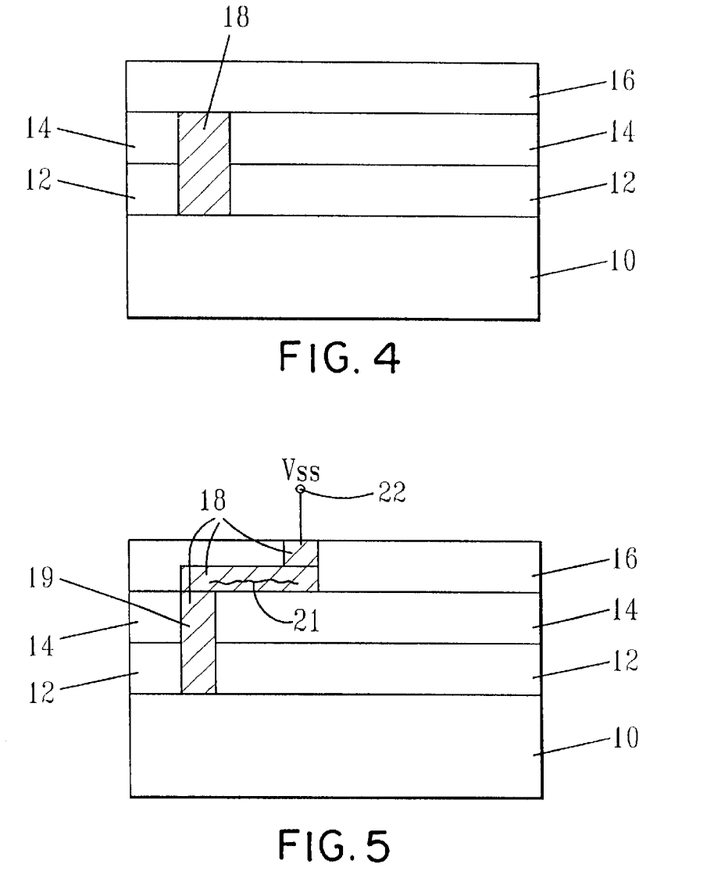
FIG. 4 is a cross-sectional view depicting one possible SOI device of the present invention wherein a polysilicon resistor is employed as the charge dissipation path.
FIG. 5 is a cross-sectional view depicting one possible SOI device of the present invention wherein a wire resistor is employed as an element of the charge dissipation path.

FIG. 4 depicts an SOI structure of the present invention wherein a resistive means is used as charge dissipation path 18. Specifically, the resistive means shown in this figure is a region containing lightly doped or intrinsic polysilicon (dopant concentration of $10^{17}/cm^3$ or less) that is formed in buried oxide region 12 and semiconducting material layer 14 of the SOI structure. This resistive region can be formed during fabrication of the SOI device or after fabrication thereof using techniques well known in the art. The charge dissipation path is connected to substrate 10 and interconnect level 16 as is shown in FIG. 4 other suitable materials that can be used in place of polysilicon include, but are not limited to: Si, selectively grown intrinsic silicon, SiGe, SiC, tantalum (Ta), tungsten (W), titanium (Ti) or other resistive refractory metals.

FIG. 5 depicts another SOI structure of the present invention wherein charge dissipation path 18 is a resistive means. Specifically, in this figure, an interconnect region 19 is formed in BOX layer 12 and semiconducting material layer 14 using conventional lithography and RIE. The interconnect region is then filled with a conductive material as described hereinabove. Next, a refractory metal wiring interconnect 21 which is capable of serving as a resistor is formed in interconnect level 16. Suitable refractory metals that can be employed in the present invention include, but are not limited to: W, Ta, Ti and alloys thereof. The refractory metal may be in elemental form, or a nitride or silicide thereof can be employed. Any number of conventional deposition processes such as CVD or sputtering may be used in forming the wiring interconnect region.

A Vss power bus or suitable circuitry 22 may be formed on top of wire interconnect 21 using conventional processing well known in the art. It is noted that elements 19, 21 and 22 are all part of charge dissipation path 18.

FIG. 6 is an example of an SOI device of the present invention wherein a field emission device or a spark gap is employed as charge dissipation path 18. It is noted that the field emission device and spark gap device are basically the same structure except that the spark gap requires a relatively small gap between surfaces for allowing the charge to jump from one edge of the SOI device to the other edge of the device. Moreover, the spark gap device operates by arc discharge whereas the field emission device operates by the emission of electrons across the gap due to high electric fields present therein. The field emission device is dependent on the anode electrode curvature and the gap spacing.

The field emission or spark gap device may have conductive electrodes deposited thereon or the semiconducting materials found in layers 10 and 14 may be used as electrodes. The structure shown in FIG. 6 is fabricated using techniques well known in the art including a chemical etch process (masked or maskless) which is highly selective in removing the buried oxide layer from the SOI device. In the field emission device embodiment, the substrate will be allowed to float a certain potential and the potential is controlled by the voltage across the field emission device. In the spark gap embodiment, the substrate will be allowed to float until a suitable spark gap voltage is achieved.

Figure 7:
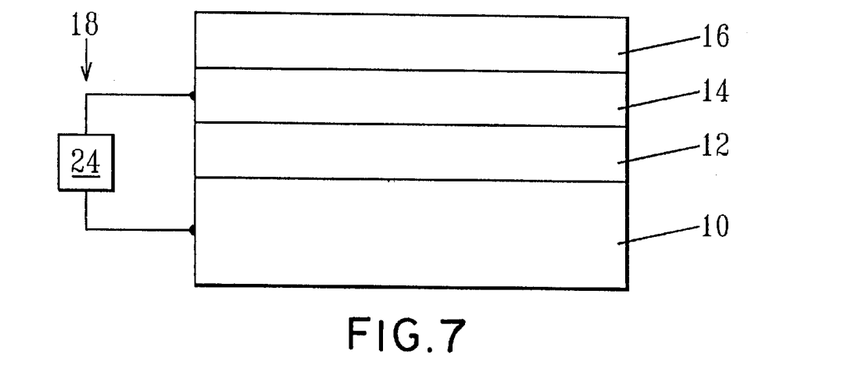
FIG. 7 is a cross-sectional view depicting one possible SOI device of the present invention wherein an external ESD circuit is employed as the charge dissipation path.
Figure 8:
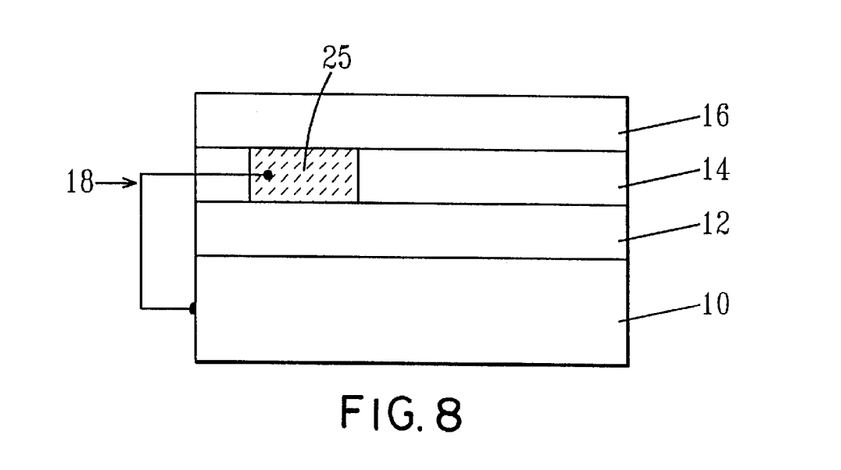
FIG. 8 is a cross-sectional view depicting an SOI device of the present invention wherein an internal SOI ESD circuit is employed as the charge dissipation path.

FIGS. 7 and 8 illustrate SOI devices of the present invention wherein an external circuit (FIG. 7) or internal circuit (FIG. 8) is employed as an element of the charge dissipation path. Specifically, the structure shown in FIG. 7 includes an external circuit 24 which is connected to semiconducting material layer 14 and semiconductor substrate 10. Any circuit can be used in the present invention as the charge dissipation path including, but not limited to: diodes, resistors, diode strings, zero $V_T$ MOSFETs, silicon controlled rectifiers, MOSFETs, body and gate-coupled MOSFETs, polybound SOI diodes and ESD networks.

FIG. 8 includes an internal SOI ESD circuit 25 which is connected to semiconductor substrate 10 and to chip ground Vss (See FIGS. 9(a)–(f)). The internal SOI circuit may comprise SOI circuitry elements and ESD elements including, but not limited to: SOI diodes, polysilicon bound SOI gated diodes, SOI MOSFETs, body and gate-coupled SOI diodes, resistors, capacitors, silicon controlled rectifiers, npn and pnp transistors.

FIGS. 9(a)–(f) demonstrate exemplary embodiments using elements stated above. Specifically, the circuit diagram in FIG. 9(a) includes SOI substrate 10, internal circuitry 25, Vss chip 30, ESD 32, input/output region 34, core region 36, and Vdd chip 38. As shown internal circuitry 25 is connected to semiconductor substrate 10 and Vss chip 30. The Vss chip 30 and Vdd chip 38 are connected through regions 32, 34 and 36.

Figure 9A:
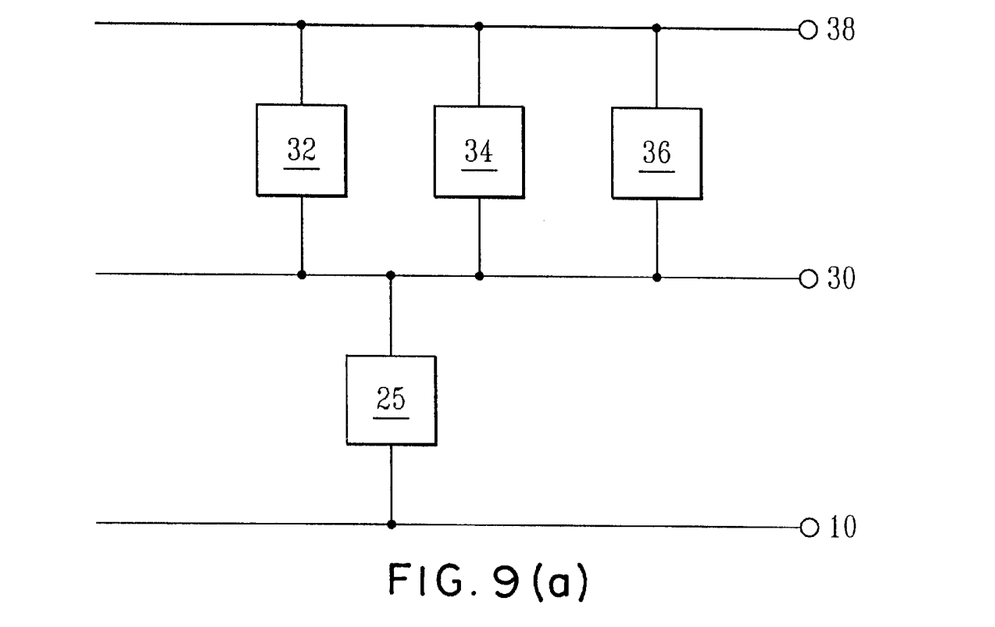
FIGS. 9(a)–(f) are circuit diagrams depicting specific ESD circuits that can be used in the SOI device of FIG. 8.
Figure 9B:
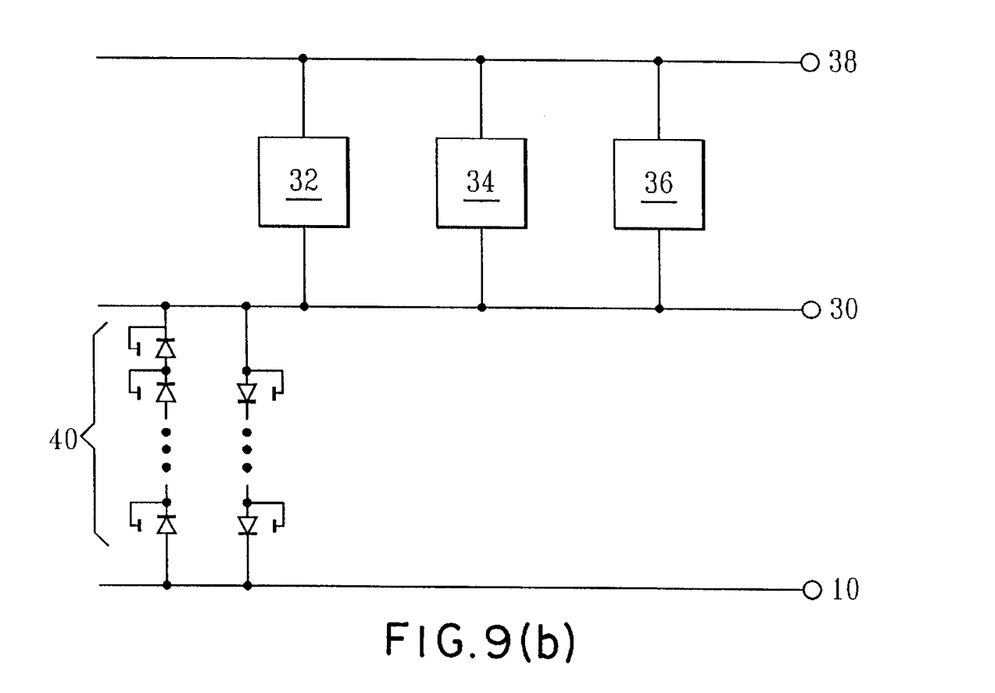

In FIG. 9(b), the SOI substrate 10 is connected to Vss chip 30 through resistive diode strings 40 (using SOI polybound gated diodes). The remaining part of the circuit is the same as in FIG. 9(a).

Figure 9C:
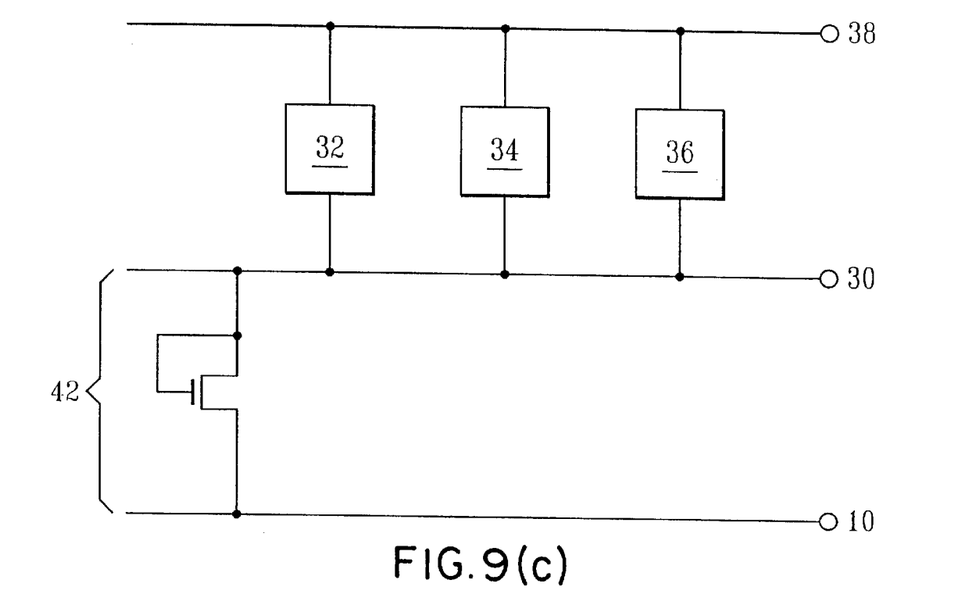

In FIG. 9(c), a long channel, narrow MOSFET 42 is used to interconnect SOI substrate 10 and Vss chip 30.

Figure 9D:
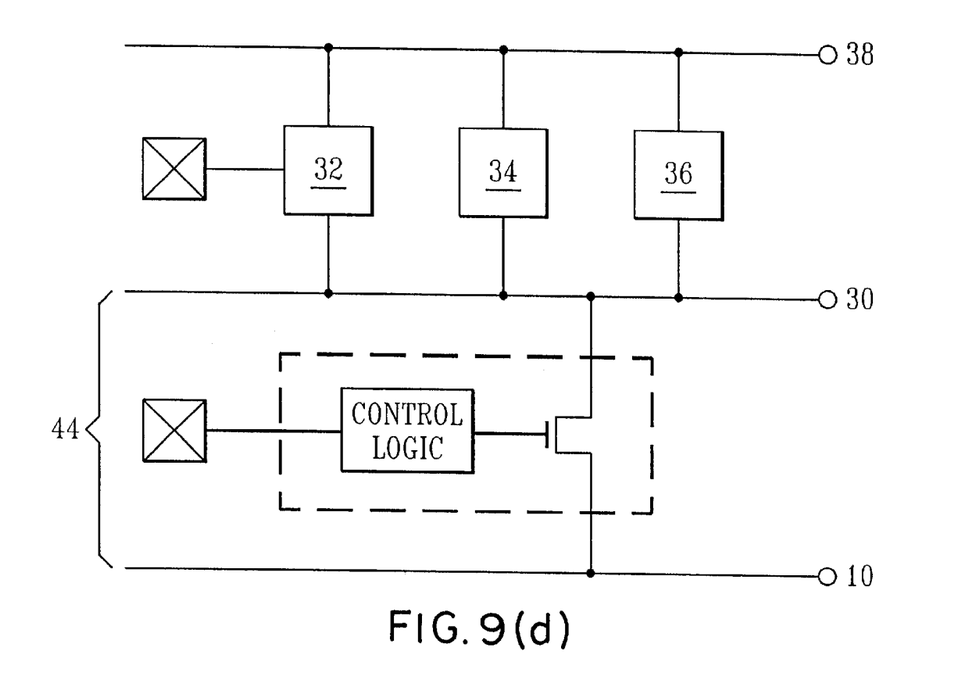
Figure 9E:
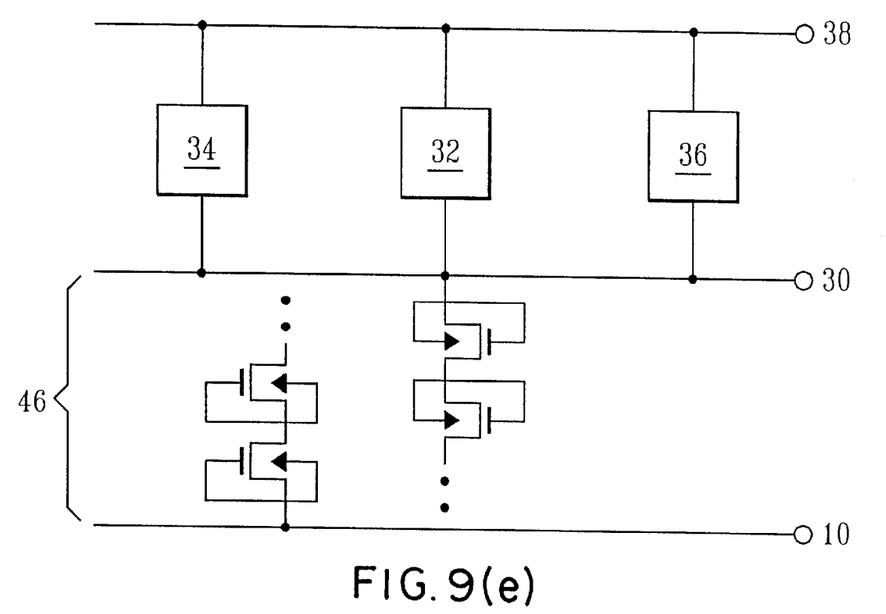
Figure 9F:
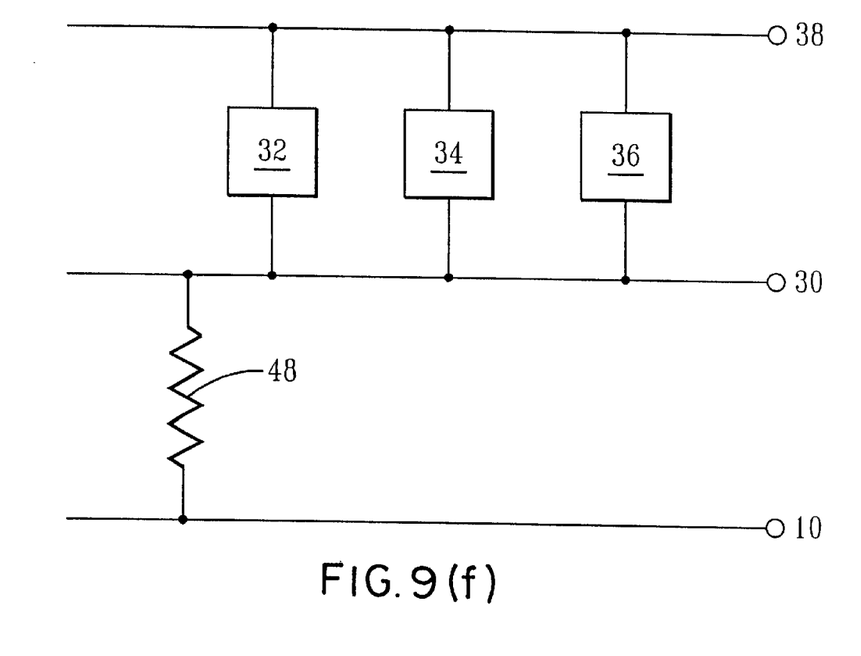

In FIG. 9(d), an ESD network 44 which is controlled by a logic device is employed as the charge dissipation path; in FIG. 9(e), a body and gate-coupled SOI diode 46 is employed-as the charge dissipation path; and in FIG. 9(f) a polysilicon resistor 48 is employed as the charge dissipation path.

Figure 10:
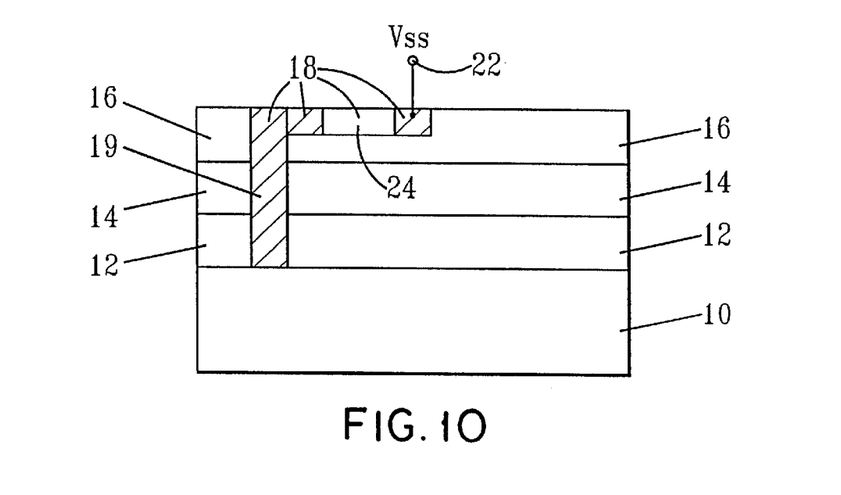
FIG. 10 is a cross-sectional view depicting one possible SOI device of the present invention wherein a fuse is employed as an element of the charge dissipation path.

The structure shown in FIG. 10 comprises an interconnect region 19 formed in layers 12, 14 and 16, a fuse 24 abutting the interconnect region, and a Vss power supply or other like circuitry 22 abutting the fuse region. The fuse region of charge dissipation path 18 may be composed of one of the above mentioned refractory metals, while the interconnect region 19 of charge dissipation path 18 is composed of a conductive material such as described hereinabove. The structure shown in FIG. 10 is formed using conventional processes well known to those skilled in the art.

While the present invention has been particularly shown and described with respect to the preferred embodiments thereof, it will be understood by those skilled in the art that the foregoing and other changes in form and details may be made therein without departing from the spirit and scope of the present invention. It is therefore intended that the present invention not be limited to the exact forms described and illustrated, but fall within the scope of the appended claims.

Having thus described our invention in detail, what we claim as new and desire to secure by the Letters Patent is:

1. A device comprising:
an SOI device comprising a semiconductor substrate, a buried oxide layer formed on said semiconductor substrate, a layer of semiconducting material formed on said buried oxide layer and an interconnect level formed on said layer of semiconducting material, said SOI device further comprising a charge dissipation path that abuts said interconnect level, said layer of semiconducting material, said buried oxide layer and said semiconductor substrate, said charge dissipation path comprises a field emission means, an arc discharge means, or a resistive means containing at least an external circuit, an internal circuit or an internal fuse.

2. The device of claim 1 wherein said resistive means includes a resistor comprised of doped or intrinsic polysilicon, Si, SiC, SiGe or a refractory metal, said resistor being formed in the SOI device.

3. The device of claim 2 wherein said refractory metal is a metal selected from the group consisting of W, Ta, Ti, refractory silicides, refractory nitrides and alloys thereof.

4. The device of claim 1 wherein said external or internal circuit is a diode, a string of diodes, a resistor, MOSFET, zero $V_T$ MOSFET, polybound SOI diode, body and gate-coupled SOI MOSFETs, or npn transistors or pnp transistors.

5. The device of claim 1 wherein said semiconductor substrate is composed of a semiconducting material selected from the group consisting of Si, Ge, SiGe, GaAs, InAs, InP and other III/V compounds.

6. The device of claim 1 wherein said semiconducting layer includes active devices regions formed therein.

7. The device of claim 1 wherein said semiconducting layer is composed of the same or different semiconducting material as the semiconductor substrate.

8. The device of claim 1 wherein said interconnect level comprises at least a dielectric material selected from the group consisting of $SiO_2$, $Si_3N_4$, diamond-like carbon, paralyene polymers, polyimides, silicon-containing polymers and other like dielectric materials.

9. The device of claim 1 wherein said charge dissipation path includes a Vss power supply or other like circuitry.

10. A device comprising:
an SOI device having at least one exposed edge, said SOI device comprising a semiconductor substrate, a buried oxide layer formed on said semiconductor substrate, a layer of semiconducting material formed on said buried oxide layer and an interconnect level formed on said layer of semiconducting material, said SOI device further comprising a charge dissipation path present on at least one of said exposed edges.

11. The semiconductor device of claim 10 wherein said charge dissipation path comprises a conductive means, a resistive means, a field emission means or an arc discharge means.

12. The device of claim 11 wherein said conductive means is a conductive material or polymer.

13. The device of claim 12 wherein said conductive material is a metal, noble metal, noble metal oxide, or mixtures and multilayers thereof.

14. The device of claim 13 wherein said conductive material is a metallic paint or metallic film which is composed of silver, gold, platinum, copper, tungsten, tantalum, titanium and other like conductive metals.

15. The device of claim 12 wherein said conductive polymer is a polymer selected from the group consisting of polyanilines, conjugated polyacetylenes, ionic conductive Li PEG derivatives, polyether-ester-amides, polyoxyethylene, polyethylene glycol-derived polyurethane oligomers, polyurethane and other like conductive polymers.

* * * * *